(12) United States Patent
Youngblood et al.

(10) Patent No.: US 9,405,198 B2
(45) Date of Patent: Aug. 2, 2016

(54) METHOD FOR PROVIDING CONDUCTIVE SILVER FILM ELEMENTS

(71) Applicants: Michael Phillip Youngblood, Rochester, NY (US); Thomas Edward Lowe, Mendon, NY (US)

(72) Inventors: Michael Phillip Youngblood, Rochester, NY (US); Thomas Edward Lowe, Mendon, NY (US)

(73) Assignee: EASTMAN KODAK COMPANY, Rochester, NY (US)

( * ) Notice: Subject to any disclaimer, the term of this patent is extended or adjusted under 35 U.S.C. 154(b) by 80 days.

(21) Appl. No.: 14/281,968

(22) Filed: May 20, 2014

(65) Prior Publication Data

US 2015/0338740 A1    Nov. 26, 2015

(51) Int. Cl.
```
G03C 5/38      (2006.01)
G03F 7/32      (2006.01)
G03F 7/30      (2006.01)
G03F 7/028     (2006.01)
G03F 7/40      (2006.01)
```

(52) U.S. Cl.
CPC .............. *G03F 7/32* (2013.01); *G03F 7/0285* (2013.01); *G03F 7/30* (2013.01); *G03F 7/40* (2013.01)

(58) Field of Classification Search
USPC .......................... 430/325, 405, 413, 419, 420
See application file for complete search history.

(56) References Cited

U.S. PATENT DOCUMENTS

| | | | |
|---|---|---|---|
| 3,464,822 A | | 9/1969 | Blake |
| 4,304,848 A | * | 12/1981 | Bouldin ................ G03C 5/40 346/135.1 |
| 7,537,800 B2 | | 5/2009 | Sasaki et al. |
| 7,829,270 B2 | | 11/2010 | Nakahira |
| 7,985,527 B2 | | 7/2011 | Tokunaga |
| 8,012,676 B2 | | 9/2011 | Yoshiki et al. |
| 8,492,296 B2 | | 7/2013 | Sasaki et al. |
| 2008/0176173 A1 | | 7/2008 | Sasaki et al. |
| 2009/0029125 A1 | | 1/2009 | Nakahira |
| 2009/0098480 A1 | | 4/2009 | Nakahira |
| 2009/0098481 A1 | | 4/2009 | Nakahira |
| 2009/0117346 A1 | | 5/2009 | Nakahira |
| 2011/0063232 A1 | | 3/2011 | Li et al. |
| 2011/0308846 A1 | | 12/2011 | Ichiki |

OTHER PUBLICATIONS

Levenson, "Superadditive Developers," Photographic Science and Engineering, vol. 13, No. 6, Nov.-Dec. 1969, pp. 299-311.
Youngblood, "Kinetics of Electron-Transfer Reactions of Hydroquinones and Ascorbic Acid with 1-Phenyl-3-pyrazolidone Radicals," Journal of American Chemical Society, vol. 111, No. 5, 1989, pp. 1843-1849.

* cited by examiner

*Primary Examiner* — Daborah Chacko Davis
(74) *Attorney, Agent, or Firm* — J. Lanny Tucker

(57) ABSTRACT

A black-and-white developing solution and a silver halide solution physical developing solution are used in sequence to provide electrically-conductive film elements from conductive film element precursors that contain photosensitive silver halide emulsions on one or both supporting sides of a transparent substrate. The two developing solutions have unique combinations of developing agents and other essential components to provide complete development of imagewise exposed silver halide and highly conductive silver metal in desired patterns on a transparent substrate.

17 Claims, No Drawings

METHOD FOR PROVIDING CONDUCTIVE SILVER FILM ELEMENTS

RELATED APPLICATIONS

Reference is made to the following copending and commonly assigned patent applications, the disclosures of all of which are incorporated herein in their entirety:

U.S. Ser. No. 13/919,203 filed Jun. 17, 2013 by Gogle, Lowe, O'Toole, and Youngblood, and published as U.S. 2015/0367620 on Dec. 18, 2014;

U.S. Ser. No. 14/166,910 filed Jan. 29, 2014 by Lushington, now issued as U.S. Pat. No. 9,247,640 on Jan. 26, 2016;

U.S. Ser. No. 14/265,418 filed Apr. 30, 2014 by Lushington, and published as U.S. 2015/0316858 on Nov. 5, 2015;

U.S. Ser. No. 14/281,977 (filed on May 20, 2014 by Youngblood and Lowe, and published as U.S. 2015/0338741 on Nov. 26, 2015) entitled "Silver Halide Developing Solution;"

U.S. Ser. No. 14/281,984 (filed on May 20, 2014 by Youngblood and Lowe, and published as U.S. 2015/0338742 on Nov. 26, 2015) entitled "Silver Halide Solution Physical Developing Solution;"

U.S. Ser. No. 14/281,923 (filed on May 20, 2014 by Lushington, Cok, and Sutton, and published as U.S. 2015/0338969 on Nov. 26, 2015) entitled "Article with Electrically-conductive Silver Connector Wire Pattern;"

U.S. Ser. No. 14/281,925 (filed on May 20, 2014 by Lushington, Sutton, and Cok, and issued as U.S. Pat. No. 9,235,130 on Jan. 12, 2016) entitled "Method for Preparing Transparent Electrically-Conductive Articles;" and U.S. Ser. No. 14/281,953 (filed on May 20, 2014 by Cok, Sutton, and Lushington, and published as U.S. 2015/0338970 on Nov. 26, 2015) entitled "Electrically-conductive Article with Improved BUS Region."

FIELD OF THE INVENTION

This invention relates to a method for providing conductive silver film elements (or electrically-conductive articles) using a unique combination of processing features and processing solutions. Such conductive silver film elements can be provided with predetermined patterns of conductive silver and used in various electronic devices or they can be further processed to provide patterns of other conductive metals that are plated over the silver. The method can be carried out using novel developing compositions after imagewise exposure of a conductive film element precursor.

BACKGROUND OF THE INVENTION

Rapid advances are occurring in various electronic devices especially display devices that are used for various communication, financial, capture, and archival purposes. For such uses as touch screen panels, electrochromic devices, light emitting diodes, field effect transistors, and liquid crystal displays, electrically-conductive films are essential and considerable efforts are being made in the industry to improve the properties of those conductive films as well as methods for making them.

In addition, as the noted display devices have developed in recent years, their attraction has increased greatly with the use of touch screen technology whereby light touches on the screen surface with a finger or stylus can create signals to cause changes in screen views or cause the reception or sending of information, telecommunications, interaction with the internet, and many other features that are being developed at an ever-increasing pace of innovation. Touch screen technology has been made possible largely by the use of transparent electrically-conductive grids on the primary display so that the location of the noted touch on the screen surface can be detected by appropriate electrical circuitry and software.

Currently, most touch screen displays use Indium Tin Oxide (ITO) coatings to create arrays of capacitive areas used to distinguish multiple point contacts. ITO coatings have significant disadvantages and efforts are being made to replace their use in various electronic devices. Indium is an expensive rare earth metal and is available in limited supply from very few sources in the world. ITO conductivity is relatively low and requires short line lengths to achieve adequate response rates. Touch screens for large displays are broken up into smaller segments to reduce the conductive line length to an acceptable resistance. ITO is a ceramic material, is not readily bent or flexed, and requires vacuum deposition with high processing temperatures to prepare the conductive layers.

Silver is an ideal conductor having conductivity 50 to 100 times greater than ITO. Silver is used in many commercial applications and is available from numerous sources. It is highly desirable to make electrically-conductive film elements using silver as the source of conductivity, but it requires considerable development or other processing operations to obtain the optimal electrically conductive properties.

U.S. Patent Application Publication 2011/0308846 (Ichiki) describes the preparation of electrically-conductive films formed by reducing a silver halide image in electrically-conductive networks with silver wire sizes less than 10 µm, which electrically-conductive films can be used to form touch panels in displays.

In addition, U.S. Pat. No. 3,464,822 (Blake) describes the use of a silver halide emulsion in a photographic element to form a conductive silver surface image by development and one or more treatment baths after development.

U.S. Pat. No. 7,829,270 (Nakahira) describes the use of photosensitive silver halide materials to form electrically-conductive silver metal patterns. After exposure of the photosensitive silver halide materials, they are processed using a black-and-white development solution followed by fixing and physical development and electroless plating operations.

Moreover, U.S. Pat. No. 8,012,676 (Yoshiki et al.) also describes similar processes but further including operations to enhance electrical conductivity of the resulting silver metal images.

Thus, it is known to provide electrically-conductive silver patterns on transparent films using various processing solutions and conditions. However, there is a further need to improve the electrical conductivity of silver patterns, especially silver patterns in the form of fine lines without increasing $D_{min}$. That is, there is a need to balance improved silver metal conductivity, increased transparency, and low $D_{min}$ in conductive silver images. It with these needs in mind, that the present invention was discovered.

SUMMARY OF THE INVENTION

The present invention provides a method for providing an electrically-conductive silver image on a transparent substrate in a conductive film element, the method comprising, in order:

imagewise exposing a conductive film element precursor comprising a transparent substrate having a first supporting side and an opposing second supporting side, and the conductive film element precursor comprising on the first supporting side, in order, a first non-color hydrophilic photosensitive layer comprising photosensitive silver halide, and optionally a first hydrophilic overcoat disposed over the first non-color hydrophilic photosensitive layer, to provide an imagewise exposed precursor comprising a first latent silver image in the first non-color hydrophilic photosensitive layer, processing the imagewise exposed precursor in a silver halide developing solution having a pH of at least 8 and up to and including 13, and comprising: (a) a primary developing agent that is a hydroquinone or ascorbic acid or derivative of either, in an amount of at least 0.01 mol/l and up to and including 1 mol/l, and (b) a catalytic developing agent that is a p-aminophenol or a phenidone or derivative of either, in an amount of at least 0.001 mol/l and up to and including 0.1 mol/l, for at least 10 seconds, to provide a first silver image corresponding to the first latent silver image in the first non-color hydrophilic photosensitive layer, processing the imagewise exposed precursor in a silver halide solution physical developing solution comprising: (a) a primary developing agent that is a hydroquinone or ascorbic acid or derivative of either, in an amount of at least 0.01 mol/l and up to and including 1 mol/l, and (c) a silver halide dissolution catalyst in an amount of at least 0.001 mol/l and up to and including 0.1 mol/l, and substantially no (b) catalytic developing agent, for at least 30 seconds at a temperature of at least 20° C., to provide an electrical conductivity of the silver image that is at least 2 times the electrical conductivity of the first silver image after only the processing with the first developing solution, processing the imagewise exposed precursor in a fixing solution to remove remaining silver ions and to provide a conductive film element containing the first silver image, treating the conductive film element to enhance electrical conductivity of the first silver image, and optionally washing and drying the conductive film element.

In some embodiments of the present invention, the method is carried out using a conductive film element precursor that further comprises, on the opposing second supporting side of the transparent substrate, a second non-color hydrophilic photosensitive layer and optionally second hydrophilic overcoat disposed over the second non-color hydrophilic photosensitive layer, and the method further comprises:

imagewise exposing the conductive film element precursor from the second opposing side of the transparent substrate, to provide a second latent silver image in the second non-color hydrophilic photosensitive layer of the imagewise exposed precursor, processing the imagewise exposed precursor in the same or different silver halide developing solution having a pH of at least 8 and up to and including 13, and comprising: (a) a primary developing agent that is a hydroquinone or ascorbic acid or derivative of either, in an amount of at least 0.01 mol/l and up to and including 1 mol/l, and (b) a catalytic developing agent that is a p-aminophenol or a phenidone or derivative of either, in an amount of at least 0.001 mol/l and up to and including 0.1 mol/l, for at least 10 seconds, to provide a second silver image corresponding to the second latent silver image in the second non-color hydrophilic photosensitive layer, processing the imagewise exposed precursor in the same or different silver halide solution physical developing solution comprising: (a) a primary developing agent that is a hydroquinone or ascorbic acid or derivative of either, in an amount of at least 0.01 mol/l and up to and including 1 mol/l, and (c) a silver halide dissolution catalyst in an amount of at least 0.001 mol/l and up to and including 0.1 mol/l, and substantially no (b) catalytic developing agent, for at least 30 seconds at a temperature of at least 20° C., to provide a conductivity of the silver image that is at least 2 times the conductivity of the second silver image after only the processing with the first developing solution, processing the imagewise exposed precursor in a fixing solution to remove remaining silver ions and to provide a conductive film element containing the second silver image, treating the conductive film element to enhance electrical conductivity of the second silver image, and optionally washing and drying the conductive film element.

The method of this invention can be used to provide a conductive film element of this invention, which conductive film element has a first silver image on the first supporting side of the transparent substrate and optionally a second silver image on the opposing second supporting side of the transparent substrate. The first and second silver images are electrically conductive and can be used alone or plated with other electrically-conductive metals.

The present invention can be carried out using a unique silver halide developing solution having a pH of at least 8 and comprising:

(a) a primary developing agent that is a hydroquinone or ascorbic acid or derivative of either in an amount of at least 0.01 mol/l and up to and including 0.15 mol/l, (b) a catalytic developing agent that is a p-aminophenol or a phenidone or derivative of either in an amount of at least 0.001 mol/l and up to and including 0.025 mol/l, and (c) one or more development inhibitors in a total amount of at least 0.25 mol/l and up to and including 2.5 mol/l.

Moreover, the present invention can also be carried out using a silver halide solution physical developing solution comprising:

(a) a primary developing agent that is a hydroquinone or ascorbic acid or derivative of either, in an amount of at least 0.01 mol/l and up to and including 1 mol/l, and (c) a silver halide dissolution catalyst in an amount of at least 0.001 mol/l and up to and including 0.1 mol/l, and the silver halide solution physical developing solution containing substantially no (b) catalytic developing agent.

The present invention provides several advantages with improved conductive film elements containing highly conductive silver metal images that can be arranged in predetermined patterns of fine lines or grids. The resulting conductive film elements exhibit high conductivity and high transparency while keeping the (visual) $D_{min}$ as low as possible, for example, less than or equal to 0.3 after processing in a fixing solution. These advantages are achieved by using a unique combination of black-and-white silver halide developing solutions before fixing.

DETAILED DESCRIPTION OF THE INVENTION

The following discussion is directed to various embodiments of the present invention and while some embodiments can be particularly desirable for specific uses, the disclosed embodiments should not be interpreted or otherwise considered to limit the scope of the present invention, as claimed below. In addition, one skilled in the art will understand that the following disclosure has broader application than is explicitly described and the discussion of any embodiment is not intended to limit the scope of the present invention.

DEFINITIONS

As used herein to define various components of the processing solutions and various layers and formulations used to prepare the conductive film element precursors, unless otherwise indicated, the singular forms "a," "an," and "the" are intended to include one or more of the components (that is, including plurality referents).

Each term that is not explicitly defined in the present application is to be understood to have a meaning that is commonly accepted by those skilled in the art. If the construction of a term would render it meaningless or essentially meaningless in its context, the term definition should be taken from an English or chemical dictionary.

The use of numerical values in the various ranges specified herein, unless otherwise expressly indicated otherwise, are considered to be approximations as though the minimum and maximum values within the stated ranges were both preceded by the word "about". In this manner, slight variations above and below the stated ranges can be used to achieve substantially the same results as the values within the ranges. In addition, the disclosure of these ranges is intended as a continuous range including every value between the minimum and maximum values.

Unless otherwise indicated, the term "weight %" refers to the amount of a component or material based on the total solids of a composition, formulation, solution, or the % of the dry weight of a layer. Unless otherwise indicated, the percentages can be the same for either a dry layer or pattern, or for the total solids of the formulation or composition used to make that layer or pattern.

Unless otherwise indicated, the term "mol %" refers to the molar amounts of a particular component (or mixture of the same class of components) within a solution or dispersion.

A "conductive film element precursor" (or "precursor") is meant to refer to an article or element used in the practice of this invention to provide the conductive film element of the present invention. Such conductive film element precursor therefore comprise a precursor to the silver metal particles, such as a silver halide as described below that is suitably converted (for example by reduction) to silver metal. Much of the discussion about the conductive film element precursors is equally applicable to the conductive film elements as most of the components and structure are not changed when silver cations in a silver halide are converted to silver metal particles. Thus, unless otherwise indicated, the discussion of substrates, hydrophilic binders and colloids, and any other addenda in silver halide layers and hydrophilic overcoats for the conductive film element precursors are also intended to describe the components of the resulting conductive film elements.

Unless otherwise indicated, the terms "conductive film element," "electrically-conductive film elements," and "electrically-conductive article" are intended to mean the same thing. They refer to the materials containing a hydrophilic layer comprising an electrically-conductive silver metal image (or other electrically-conductive metal image) disposed on one or both supporting sides of a suitable substrate. Other components of the electrically-conductive article or conductive film element are described below.

The term "first" refers to the layers on one supporting side of the substrate and the term "second" refers to the layers on the opposing (opposite) supporting side of the substrate. Each supporting side of the substrate can be equally useful and the term "first" does not necessarily mean that one side is the primary or better supporting side of the support.

The terms "duplex" and "two-sided" are used herein in reference to conductive film element precursors and conductive film elements having the described layers on both supporting sides of the substrate. Unless otherwise indicated herein, the relationships and compositions of the various layers can be the same or different on both supporting sides of the substrate. Moreover, the silver halides disposed on the opposing supporting sides of the substrate can be imaged and processed using the same or different processing solutions and conditions.

ESD refers to "equivalent spherical diameter" and is a term used in the photographic art to define the size of particles such as silver halide grains. Particle size of silver halide grains as expressed in grain ESD can be readily determined using disc centrifuge instrumentation.

Unless otherwise indicated, "black-and-white" refers to silver-forming black-and-white materials and formulations, and not chromogenic black-and-white materials and formulations.

Uses

The conductive film element precursors can be used in the practice this invention to form conductive film elements comprising an electrically-conductive silver metal pattern on one or both supporting sides of a suitable substrate. These conductive film elements can be used as devices themselves or they can be used as components in devices having a variety of applications including but not limited to, electronic, optical, sensory, and diagnostic uses. More details of such uses are provided below. In particular, it is desired to use the conductive film element precursors of the present invention to provide highly electrically-conductive silver metal patterns (or other conductive metal patterns) comprising lines having a line resolution (line width) of less than 50 µm, or less than 15 µm or even less than 10 µm and as low as 1 µm.

It is particularly useful to prepare conductive film elements comprising electrically-conductive silver patterns on first and opposing second supporting sides of a transparent substrate. Such electronic and optical devices and components include but are not limited to, radio frequency tags (RFID), sensors, touch screen displays, and memory and back panels for displays.

Conductive Film Element Precursors

The conductive film element precursors useful in the practice of this invention are photosensitive but do not contain chemistry sufficient to provide color photographic images. Thus, these precursors are considered to be black-and-white photosensitive materials forming metallic silver images following exposure and processing, and are "non-color image-forming".

The conductive film element precursors and the resulting conductive film elements, including the transparent substrate and all accompanying layers on one or both supporting sides, are considered transparent meaning that the integrated transmittance over the noted visible region of the electromagnetic spectrum (for example from 410 nm to 700 nm) through the entire element can be 70% or more, or more likely at least 85% or even 90% or more. Integrated transmittance can be determined using a spectrophotometer and known procedures.

Conductive film element precursors having the same or different essential layers on both supporting sides of the transparent substrate can be known as "duplex" or "two-sided" conductive film element precursors.

The conductive film element precursor can be formed by providing a first non-color (that is, silver metal forming black-and-white) hydrophilic photosensitive layer on at least one supporting or planar side (as opposed to non-supporting edges) of a suitable transparent substrate in a suitable manner. This first non-color hydrophilic photosensitive layer comprises a silver halide, or a mixture of silver halides, at a total silver coverage of at least 2500 mg Ag/m$^2$, or at least 3500 mg Ag/m$^2$ and in many embodiments less than 5000 mg Ag/m$^2$, for example up to and including 4900 mg Ag/m$^2$. However, higher silver coverage can be used if desired. Thus, this non-color hydrophilic photosensitive layer has sufficient silver halide intrinsic or added spectral sensitization to be photosensitive to selected imaging irradiation (described below). The photosensitive layers can be the same or different in composition and spectral sensitization on the opposing supporting sides of the transparent substrate.

The one or more silver halides are dispersed within one or more suitable hydrophilic binders or colloids as described below also.

Such conductive film element precursors are therefore treated (imagewise exposed) in a manner as to convert the silver cations (such as by reduction) into silver metal particles, and this exposed precursor can then be converted into a conductive film element of the present invention after appropriate treatment or processing steps described below.

The conductive film element precursors consist essentially of one essential layer on each supporting side of the substrate, which essential layer a non-color hydrophilic photosensitive layer disposed on the transparent substrate. This essential layer can be disposed on only one supporting side of the transparent substrate, but in many duplex embodiments, it is disposed on both first and opposing second supporting sides of the transparent substrate. Hydrophilic overcoats described below are optional but highly desired in many embodiments, and such hydrophilic overcoats are disposed directly on the non-color hydrophilic photosensitive layer. These layers can be disposed on only one supporting side of the transparent substrate, or they can be disposed on both first supporting and opposing second supporting sides of the transparent substrate, in the same order. Other optional layers can also be present on either or both supporting sides as described below.

Transparent Substrates:

The choice of transparent substrate generally depends upon the intended utility of the resulting electrically-conductive film element. It can be rigid or flexible, and generally transparent as described above. For example, the substrate can be a transparent, flexible substrate having an integrated transmittance of at least 80% and generally at least 95% as measured using a standard spectrophotometer and procedures over the noted visible region of the electromagnetic spectrum as described above.

Suitable transparent substrates include but are not limited to, glass, glass-reinforced epoxy laminates, cellulose triacetate or another cellulose ester, acrylic esters, polycarbonates, adhesive-coated polymer substrates, polymer substrates (such as polyester films), and composite materials. Suitable polymers for use as polymer substrates include but are not limited to, polyethylene, polyesters such as polyethylene terephthalate (PET) and polyethylene naphthalate (PEN), polypropylenes, polyvinyl acetates, polyurethanes, polyamides, polyimides, polysulfones, and mixtures thereof.

Polymeric substrates can also comprise two or more layers of the same or different polymeric composition so that the composite substrate (or laminate) has the same or different layer refractive properties. The transparent substrate can be treated on either or both supporting sides to improve adhesion of a silver salt emulsion or dispersion to one or both supporting sides of the substrate. For example, the transparent substrate can be coated with a polymer adhesive layer on one or both supporting sides or they can be chemically treated or subjected to a corona treatment.

Biaxially-oriented sheets, while described as having at least one layer, can also be provided with additional layers that can serve to change the optical or other properties of the biaxially-oriented sheet. Such layers might contain tints, antistatic or conductive materials, or slip agents. The biaxially-oriented extrusion can be carried out with as many as 10 layers if desired to achieve some particular desired property.

Particularly useful transparent substrates for the manufacture of flexible electronic devices or touch screen components are flexible, which feature aids rapid roll-to-roll application. Estar® poly(ethylene terephthalate) films and cellulose triacetate films are particularly useful materials for making flexible transparent substrates for this invention.

The transparent substrate can be the same as a support or film that is already incorporated into a flexible display device, by which it is meant that essential layers described herein are applied to a transparent substrate material within a display device and imaged in situ according to a desired pattern, and then processed in situ.

Where a discrete transparent substrate is utilized (that is, the transparent substrate is not already incorporated in a flexible display device), the layers (from formulations) are provided on to one or both supporting sides thereof. If different patterns (or grids) are intended for each supporting side, the substrate or optional intervening filter (or antihalation) layers comprising filter dyes can be provided to prevent light exposure from one side reaching the other. Alternatively, the silver halide emulsions can be sensitized differently for the opposing non-color hydrophilic photosensitive layers on opposing supporting sides of the transparent substrate.

The transparent substrate used in the conductive film element precursor can have a thickness of at least 20 μm and up to and including 300 μm or typically at least 75 μm and up to and including 200 μm. Antioxidants, brightening agents, antistatic or conductive agents, plasticizers, and other known additives can be incorporated into the transparent substrate, if desired, in amounts that would be readily apparent to one skilled in the art.

Non-Color Hydrophilic Photosensitive Layers:

The essential silver halide(s) in these layers comprise silver cations of one or more silver halides that can be converted into silver metal particles according to a desired pattern upon exposure of each non-color hydrophilic photosensitive layer in an imagewise fashion. The latent image can then be developed into a silver metal image using known silver development procedures and chemistry (described below). The silver halide (or combination of silver halides) is photosensitive, meaning that radiation from UV to visible light (for example, of at least 200 nm and up to and including 750 nm radiation) is generally used to convert silver cations to silver metal particles in a latent image. In some embodiments, the silver halide is present in combination with a thermally-sensitive silver salt (such as silver behenate) and the non-color photosensitive hydrophilic layer can be both photosensitive and thermally sensitive (sensitive to imaging thermal energy such as infrared radiation).

The useful photosensitive silver halides can be, for example, silver chloride, silver bromide, silver chlorobromoiodide, silver bromochloroiodide, silver chlorobromide, silver bromochloride, or silver bromoiodide that are prepared as individual compositions (or emulsions). The various halides are listed in the silver halide name in descending order of halide amount. In addition, individual silver halide emulsions can be prepared and mixed to form a mixture of silver halide emulsions that are used on the same or different supporting sides of the substrate. In general, the useful silver halides can comprise up to and including 100 mol % of chloride or up to and including 100 mol % of bromide, and up to and including 5 mol % iodide, all based on total silver.

The silver halide grains used in each non-color hydrophilic photosensitive layer generally can have an ESD of at least 30 nm and up to and including 300 nm, or more likely at least 50 nm and up to and including 200 nm.

The coverage of total silver in the silver halide(s) in each non-color hydrophilic photosensitive layer can be at least 2500 mg Ag/m$^2$ and typically at least 3500 mg Ag/m$^2$ and up to any amount but generally less than 5000 mg Ag/m$^2$, for example up to and including 4900 mg Ag/m$^2$. Higher silver coverage can be used if desired.

The dry thickness of each non-color hydrophilic photosensitive layer can be generally at least 0.5 μm and up to and including 12 μm, and particularly at least 0.5 μm and up to and including 7 μm.

The final dry non-color hydrophilic photosensitive layer can be made up of one or more individually coated non-color hydrophilic photosensitive sub-layers that can be applied using the same or different silver halide emulsion formulations. Each sub-layer can be composed of the same or different silver halide(s), hydrophilic binders or colloids, and addenda. The sub-layers can have the same or different amount of silver content.

The photosensitive silver halide(s) used in the first non-color hydrophilic photosensitive layer can be the same or different from the photosensitive silver halide(s) used in the opposing second supporting side non-color hydrophilic photosensitive layer.

The photosensitive silver halide grains (and any addenda associated therewith as described below) are dispersed (generally uniformly) in one or more suitable hydrophilic binders or colloids to form a hydrophilic silver halide emulsion. Examples of such hydrophilic binders or colloids include but are not limited to, gelatin and gelatin derivatives, polyvinyl alcohol (PVA), poly(vinyl pyrrolidone) (PVP), casein, and mixtures thereof. Suitable hydrophilic colloids and vinyl polymers and copolymers are also described in Section IX of *Research Disclosure* Item 36544, September 1994 that is published by Kenneth Mason Publications, Emsworth, Hants, PO10 7DQ, UK.

The amount of hydrophilic binder or colloid in each non-color hydrophilic photosensitive layer can be adapted to the particular dry thickness that is desired as well as the amount of silver halide that is incorporated. It can also be adapted to meet desired dispersibility, swelling, and layer adhesion to the transparent substrate. In general, the one or more hydrophilic binders or colloids can be present in an amount of at least 10 weight % and up to and including 95 weight % based on the total solids in the emulsion formulation or dry layer.

Some useful non-color hydrophilic photosensitive layer compositions have a relatively high silver ion/low hydrophilic binder (for example, gelatin) weight ratio. For example, a particularly useful weight ratio of silver ions (and eventually silver metal) to hydrophilic binder or colloid such as gelatin (or its derivative) can be at least 0.1:1, or even at least 1.5:1 and up to and including 10:1. A particularly useful weight ratio of silver ions to the hydrophilic binder or colloid can be at least 2:1 and up to and including 5:1. Different ratios can be used if desired for a given purpose.

The hydrophilic binder or colloid can be used in combination with one or more hardeners designed to harden the particular hydrophilic binder such as gelatin. Particularly useful hardeners for gelatin and gelatin derivatives include but are not limited to, non-polymeric vinyl-sulfones such as bis(vinyl-sulfonyl) methane (BVSM), bis(vinyl-sulfonyl methyl) ether (BVSME), and 1,2-bis(vinyl-sulfonyl acetamide) ethane (BVSAE). Mixtures of hardeners can be used if desired. The hardeners can be incorporated into each non-color hydrophilic photosensitive layer in any suitable amount that would be readily apparent to one skilled in the art.

In general, each non-color hydrophilic photosensitive layer can have a swell ratio of at least 150% as determined by optical microscopy of element cross-sections. Swelling can be controlled by the amount of hardening that is carried out with appropriate amounts of hardeners within the photosensitive silver halide emulsion layer or within various processing solutions (described below).

If desired, the useful silver halide described above can be sensitized to any suitable wavelength of exposing radiation. Organic sensitizing dyes can be used, but it can be advantageous to sensitize the silver salt to the UV portion of the electromagnetic spectrum without using visible light sensitizing dyes to avoid unwanted dye stains in the conductive article is intended to have high transparency. Alternatively, the silver halides can be used without spectral sensitization beyond their intrinsic spectral sensitivities.

Non-limiting examples of addenda useful to be included with the silver halides, including chemical and spectral sensitizers, filter dyes, organic solvents, thickeners, dopants, emulsifiers, surfactants, stabilizers, hardeners, and antifoggants are described in *Research Disclosure* Item 36544, September 1994 and the many publications identified therein. Such materials are well known in the art and it would not be difficult for a skilled artisan to formulate or use such components for purposes described herein. Some useful silver salt emulsions are described, for example in U.S. Pat. No. 7,351,523 (Grzeskowiak), U.S. Pat. Nos. 5,589,318, and 5,512,415 (both to Dale et al.).

Useful silver halide emulsions containing silver halide grains that can be reduced to silver metal particles can be prepared by any suitable method of grain growth, for example, by using a balanced double run of silver nitrate and salt solutions using a feedback system designed to maintain the silver ion concentration in the growth reactor. Known dopants can be introduced uniformly from start to finish of precipitation or can be structured into regions or bands within the silver halide grains. Useful dopants include but are not limited to, osmium dopants, ruthenium dopants, iron dopants, rhodium dopants, iridium dopants, and cyanoruthenate dopants. A combination of osmium and iridium dopants such as a combination of osmium nitrosyl pentachloride and iridium dopant is useful. Such complexes can be alternatively utilized as grain surface modifiers in the manner described in U.S. Pat. No. 5,385,817 (Bell). Chemical sensitization can be carried out by any of the known silver halide chemical sensitization methods, for example using thiosulfate or another labile sulfur compound alone, or in combination with gold complexes.

Useful silver halide grains can be rounded cubic, cubic-rounded, octahedral, rounded octahedral, polymorphic, tabular, or thin tabular emulsion grains. Such silver halide grains can be regular untwinned, regular twinned, or irregular twinned with cubic or octahedral faces. In one embodiment, the silver halide grains can be rounded cubic having an edge length of less than 0.5 μm and at least 0.05 μm.

Antifoggants and stabilizers can be added to give the silver halide emulsion the desired sensitivity, if appropriate. Antifoggants that can be used include, for example, azaindenes such as tetraazaindenes, tetrazoles, benzotriazoles, imidazoles and benzimidazoles.

The essential silver halide grains and hydrophilic binders or colloids, and optional addenda can be formulated and coated as a silver halide emulsion using suitable emulsion solvents including water and water-miscible organic solvents. For example, useful solvents for making the silver halide emulsion or coating formulation can be water, an alcohol such as methanol, a ketone such as acetone, an amide such as formamide, a sulfoxide such as dimethyl sulfoxide, an ester such as ethyl acetate, an ether, a liquid polyvinyl alcohol, liquid or low molecular weight poly(vinyl alcohol), or combinations of these solvents. The amount of one or more solvents used to prepare the silver halide emulsions can be at least 30 weight % and up to and including 50 weight % of the total formulation weight. Thus, such coating formulations can be prepared using any of the photographic emulsion making procedures that are known in the art.

Hydrophilic Overcoats

While the non-color hydrophilic photosensitive layer can be the outermost layer in the precursor, in many embodiments, a hydrophilic overcoat can be disposed over each non-color hydrophilic photosensitive layer, on either or both supporting sides of the transparent substrate. This hydrophilic overcoat can be the outermost layer in the conductive film element precursor (that is, there are no layers purposely placed over it on either or both supporting sides of the transparent substrate). Thus, generally if both supporting sides of the transparent substrate are used to provide an electrically-conductive silver pattern, then a hydrophilic overcoat can be present on both supporting sides of the transparent substrate. Thus, a first hydrophilic overcoat can be disposed over the first non-color hydrophilic photosensitive layer, and a second hydrophilic overcoat can be disposed over a second non-color second hydrophilic photosensitive layer on the opposing supporting side of the substrate.

In most embodiments, each hydrophilic overcoat can be directly disposed on each non-color hydrophilic photosensitive layer, meaning that there are no intervening layers on the supporting sides of the transparent substrate. The chemical compositions and dry thickness of these hydrophilic overcoats can be the same or different, but in most embodiments they have essentially the same chemical composition and dry thickness on both supporting sides of the transparent substrate.

In some embodiments, each hydrophilic overcoat (first or second, or both) can comprise one or more silver halides in the same or different amount so as to provide silver metal particles, after exposure and processing, in an amount of at least 5 mg $Ag/m^2$ and up to and including 150 mg $Ag/m^2$, or at least 5 mg $Ag/m^2$ and up to and including 100 mg $Ag/m^2$.

This silver halide can be dispersed (generally uniformly) within one or more hydrophilic binders or colloids in each hydrophilic overcoat, which hydrophilic binders or colloids include those described above for the non-color hydrophilic photosensitive layers. In many embodiments, the same hydrophilic binders or colloids can be used in all of the layers of the conductive film element precursor. However, different hydrophilic binders or colloids can be used in the various layers, and on either or both supporting sides of the supporting substrate. The amount of one or more hydrophilic binders or colloids in each hydrophilic overcoat can be the same or different and generally at least 50 weight % and up to and including 97 weight %, based on total hydrophilic overcoat dry weight.

The hydrophilic overcoat can include one or more radiation absorbers such as UV radiation absorbers in an amount of at least 5 $mg/m^2$ and up to and including 100 $mg/m^2$. Useful UV radiation absorbers can be "immobilized" so that they do not readily diffuse out of the hydrophilic overcoat.

Each hydrophilic overcoat can also comprise one or more hardeners for a hydrophilic binder or colloid (such as gelatin or a gelatin derivative). Useful hardeners are described above.

It is also possible that the silver halide(s) in each hydrophilic overcoat is the same as the silver halide(s) in each non-color hydrophilic photosensitive layer over which it is disposed.

Moreover, the one or more silver halides in each hydrophilic overcoat can have a grain ESD of at least 30 nm and up to and including 1000 nm, or at least 30 nm and up to and including 300 nm.

In some embodiments, the one or more silver halides in each hydrophilic overcoat has a grain ESD that is larger than the grain ESD of the silver halide in the non-color hydrophilic photosensitive layer over which it is disposed.

The dry thickness of the each hydrophilic overcoat can be at least 100 nm and up to and including 800 nm or more particularly at least 300 nm and up to and including 500 nm. In many embodiments, the grain ESD to dry thickness ratio in the hydrophilic overcoat can be from 0.25:1 to and including 1.75:1 or more likely from 0.5:1 to and including 1.25:1.

In various embodiments, the silver halide(s) in each hydrophilic overcoat can comprise up to 100 mol % bromide or up to 100 mol % chloride, and up to and including 3 mol % iodide, all molar amounts based on total silver content.

In other embodiments, the silver halide(s) in each hydrophilic overcoat can comprise more chloride than the silver halide in the non-color hydrophilic photosensitive layer over which it is disposed. This relationship can be the same or different on both supporting sides of the substrate in such "duplex" conductive film element precursors.

In useful embodiments, the silver halide(s) in each hydrophilic overcoat can comprise at least 80 mol % bromide, and the remainder is chloride or iodide, based on total silver content, and the silver halide(s) in the non-color hydrophilic photosensitive layer over which it is disposed can have at least 80 mol % bromide, and the remainder is iodide or chloride, all based on total silver content.

It is also useful in conductive film element precursors of the present invention that the silver halide(s) in the each hydrophilic overcoat and the silver halide(s) in each non-color hydrophilic photosensitive layer over which it is disposed are matched in photographic speed. This is best achieved when the exposure sensitivity of the silver halide emulsion(s) in the hydrophilic overcoat can be at least 10% and up to and including 200% of the optimum sensitivity of silver halide emulsion in the underlying non-color hydrophilic photosensitive layer used to provide the conductive silver pattern, as expressed in $\mu J/m^2$.

Additional Layers:

In addition to the layers and components described above on one or both supporting sides of the transparent substrate, the conductive film element precursor used in the practice of this invention can also include other layers that are not essential but can provide some additional properties or benefits, such as radiation absorbing filter layers, adhesion layers, and other layers as are known in the photographic art. The radiation absorbing filter layers can also be known as "antihalation" layers that can be located between the essential layers on each supporting side of the transparent substrate. For example, each supporting side can have a radiation absorbing filter layer disposed directly on it, and directly disposed underneath the non-color hydrophilic photosensitive layer.

Such radiation absorbing filter layers can include one or more filter dyes that absorb in the UV, red, green, or blue regions of the electromagnetic spectrum, or any combination thereof, and can be located between the substrate and the non-color hydrophilic photosensitive layer on one or both supporting sides of the transparent substrate.

For example, the conductive film element precursor can comprise an UV radiation absorbing layer between a first supporting side of the transparent substrate and the first non-color hydrophilic photosensitive layer.

The duplex conductive film element precursors further comprise on the opposing second supporting side of the transparent substrate, a second non-color hydrophilic photosensitive layer and a second hydrophilic overcoat disposed over the second non-color hydrophilic photosensitive layer. A radiation (for example, UV) absorbing filter layer can be disposed between the or opposing second supporting side of the transparent substrate and the second non-color hydrophilic photosensitive layer, which radiation absorbing layer can be the same as or different from the radiation absorbing filter layer on the first supporting side of the transparent substrate.

In many duplex embodiments, the second non-color hydrophilic photosensitive layer and the second hydrophilic overcoat have the same composition as the first non-color hydrophilic photosensitive layer and the first hydrophilic overcoat, respectively.

Thus, in some embodiments, the conductive film element precursor can further comprise, on the opposing second supporting side of the transparent substrate, a second non-color hydrophilic photosensitive layer and optionally, a second hydrophilic overcoat disposed over the second non-color hydrophilic photosensitive layer.

For example, the second non-color hydrophilic photosensitive layer and the second hydrophilic overcoat can have the same composition as the first non-color hydrophilic photosensitive layer and the first hydrophilic overcoat, respectively.

In other embodiments, the exposure sensitivity of the silver halide emulsion in the first hydrophilic overcoat can be at least 10% and up to and including 200% of the optimum sensitivity of the silver halide emulsion in the first non-color hydrophilic photosensitive layer, as expressed as $\mu J/m^2$, and the exposure sensitivity of the silver halide emulsion in the second hydrophilic overcoat can be at least 10% and up to and including 200% of the optimum sensitivity of the silver halide emulsion in the second non-color hydrophilic photosensitive layer, as expressed as $\mu J/m^2$. The optimum sensitivities of the respective sides of the transparent substrate can be the same or different.

Preparing Conductive Film Element Precursors

The various layers are formulated using appropriate components and coating solvents and are applied to one or both supporting sides of a suitable transparent substrate (as described above) using known coating procedures including those commonly used in the photographic industry (for example, bead coating, blade coating, curtain coating, spray coating, and hopper coating). Each layer can be applied to each supporting side of the transparent substrate in single-pass procedures or simultaneous multi-layer coating procedures.

Providing Conductive Film Elements

The conductive film element precursors are provided for use in the method of this invention and then imagewise exposed to provide a latent silver metal image in the non-color hydrophilic photosensitive layers either or both supporting sides of the transparent substrate. Imagewise exposure also reduces any silver halide(s) present in the hydrophilic overcoat(s) to silver metal particles. The conductive film element precursors can be used immediately for an intended purpose, or they can be stored in roll or sheet form for later use. For example, the precursors can be rolled up during manufacture and stored for use in a roll-to-roll imaging and processing process, and subsequently cut into desired sizes and shapes.

More commonly, photosensitive silver halides in each non-color hydrophilic photosensitive layer can be imagewise exposed to appropriate actinic radiation (UV to visible radiation) from a suitable source that are well known in the art, and then developed (silver ions reduced to silver metal particles) as described below. Such exposure provides an imagewise exposed precursor comprising a latent silver image in the first non-color hydrophilic photosensitive layer, and also a latent silver image in the second non-color hydrophilic photosensitive layer if it is present in the precursor.

In some embodiments, the exposure processes are controlled so that any exposing radiation for the non-color hydrophilic photosensitive layer on one supporting side of the transparent substrate does not reach any non-color hydrophilic photosensitive layer on the opposing second supporting side of the transparent substrate. This result can be achieved in various ways as described for example in U.S. Patent Application 2011/0289771 (Kuriki) the disclosure of which is incorporated herein by reference. It is particularly useful to include a radiation filter dye layer or antihalation layer on both sides of the transparent substrate, which layer is arranged between the transparent substrate and each (first and second) non-color hydrophilic photosensitive layer, and the exposing is carried out using radiation directed at the conductive film element precursor from the first (or second, or both) supporting side of the transparent substrate.

Processing with a Silver Halide Developing Solution:

A first processing treatment can be carried out using a silver halide developing solution (silver metal forming black-and-white developer) that has a pH of at least 8 and up to and including 13, or more typically of at least 10 and up to and including 11. The pH can be provided using known alkaline reagents along with the compounds described below.

A first essential component of this silver halide developing solution is one or more primary developing agents such as a hydroquinone or a derivative thereof, or an ascorbic acid or a derivative thereof. Useful hydroquinone or derivatives (also known as polyhydroxybenzenes) include but are not limited to, hydroquinone, cathecol, pyrogallol, methylhydroquinone, chlorohydroquinone, hydroquinonemonosulfate, 1,2-naphthalenediol, and 1,4-naphthalenediol. Useful ascorbic acid and derivatives include but are not limited to, ascorbic acid, erythrobic acid and its derivatives, sodium ascorbate, and sodium erythrobate.

The one or more primary developing agents can be present in the silver halide developing solution in a total amount of at least 0.01 mol/l and up to and including 1 mol/l, at least 0.01 mol/l and up to and including 0.15 mol/l, or more typically of at least 0.075 mol/l and up to and including 0.14 mol/l. As noted above, mixtures of primary developing agents can be used if desired and in such embodiments, these concentrations refer to the total amount of the primary developing agent.

The silver halide developing solution also comprises one or more catalytic developing agents as a second essential component, and such compounds are p-aminophenols or derivatives thereof or a phenidone (including derivatives of phenidone). Such catalytic developing agents can be present in the silver halide developing solution in a total amount of at least 0.001 mol/l and up to and including 0.1 mol/l, at least 0.001 mol/l and up to and including 0.025 mol/l, or typically of at least 0.001 and up to and including 0.002 mol/l. When mixtures of these compounds are used, the concentrations refer to the total amounts of catalytic developing agents.

Compared to the primary developing agents that are the primary silver ion developing agents (reducing agents), the presence of the catalytic developing agent is desired in order to increase the kinetics of development, especially by reducing or eliminating development induction time.

Useful p-aminophenols include but are not limited to, p-methylaminophenol, p-aminophenol, m-chloro-p-aminophenol, m-methyl-p-aminophenol, and p-hydroxyphenylglycine. Useful phenidone and derivatives include but are not limited to, substituted or unsubstituted phenidone such as 4,4-dimethyl-3-pyrazolidinone (dimezone) and 4-(hydroxymethyl)-4-methyl-1-phenyl-3-pyrazolidinone (HMMP).

In general, the concentration of the one or more catalytic developing agents can be less than the concentration of the one or more primary developing agents. More particular, the total concentration of the one or more primary developing agents can be at least 100 times the total concentration of the one or more catalytic developing agents.

In many embodiments, the silver halide developing solution has hydroquinone or a derivative thereof as the primary developing agent and phenidone as the catalytic developing agent.

Important optional components of the silver halide developing solution include but are not limited to, one or more alkali metal sulfites and one or more development inhibitors or restrainers such as alkali metal halides, substituted or unsubstituted mercaptotetrazoles, one or more benzotriazoles, one or more aryl or alkyl disulfides, and one or more aryl or alkyl thiols. Mixtures of any of the same or different classes of compounds can be used.

For example, useful alkali metal sulfites include sodium sulfite, potassium sulfite, and mixtures thereof. The alkali metal sulfites can be present in the silver halide developing solution in a total amount of at least 0.1 mol/l and up to and including 1 mol/l or typically of at least 0.4 mol/l and up to and including 0.8 mol/l. This concentration refers to the total amount of all sulfites if a mixture of compounds is used.

The one or more development inhibitors or restrainers, such as at least one of any of an alkali metal halide, an arylmercaptotetrazole, a benzotriazole, and an aryl or alkyl disulfide, or an aryl or alkyl thiol, can be present in the silver halide developing solution in a total amount of at least 0.25 mmol/l and up to and including 2.5 mmol/l or typically of at least 0.5 mmol/l and up to and including 1.5 mmol/l.

Useful alkali metal halides include but are not limited to, sodium chloride, sodium bromide, potassium chloride, and potassium bromide.

Useful substituted or unsubstituted arylmercaptotetrazoles include compounds include but are not limited to, 1-phenyl-5-mercaptotetrazole (PMT), 1-ethyl-5-mercaptotetrazole, 1-t-butyl-5-mercaptotetrazole, and 1-pyridinyl-5-mercaptotetrazoles.

Useful benzotriazoles include but are not limited to, substituted and unsubstituted benzotriazole compounds such as benzotriazole, 5-methylbenzotriazole, and 5,6-dichlorobenzotriazole.

Useful aryl or alkyl disulfides include but are not limited to, 5,5'-(dithiobis(4,1-phenyleneimino))bis(5-oxo-pentanoic acid) and its disodium salt, 2,2'-diethiobisbenzoic acid and its disodium salt, and 5,5'-dithiobis(pentanoic acid) and its disodium salt.

Useful aryl or alkyl thiols include but are not limited to, 5-mercapto-4,1-phenylimino-5-oxo-pentanoic acid and its sodium salt and 5-mercaptopentanoic acid and its sodium salt.

Other addenda that can be present in the silver halide developing solution in known amounts include but are not limited to, metal chelating agents, preservatives (besides the sulfites), biocides, antioxidants, small amounts of water-miscible organic solvents (such as benzyl alcohol and diethylene glycol), nucleators, acids, bases (such as alkali hydroxides), and buffers (such as carbonate, borax, phosphates, and other basic salts).

The silver halide developing solution can be provided at working strength or in a concentrated form that can be suitably diluted prior to or during processing using known processing equipment and procedures. For example, the silver halide developing solution can be concentrated at least 5 times compared to a desired working strength concentration.

Thus, the silver halide developing solution can be used to process or treat the imagewise exposed precursor for a suitable time and at a suitable temperature, at generally atmospheric pressure to achieve development of at least 75 mol %, and typically at least 90 mol % of the exposed silver ion in the imagewise exposed first (or second) non-color hydrophilic photosensitive layer, as well as at least 90 mol % of any silver ion in each hydrophilic overcoat that can be present.

For example, the processing temperatures for using the silver halide developing solution can range from at least 15° C. and up to and including 60° C. or typically of at least 35° C. and up to and including 45° C. Useful processing times can range from at least 10 seconds and up to and including 10 minutes but more likely up to and including 1 minute. A skilled worker could use routine experimentation to find the optimum processing conditions to achieve the desired results in reducing the silver ion to silver metal in the latent image. A washing or rinsing treatment using water or a suitable aqueous solution can be carried out for a suitable time and at a suitable temperature after this processing feature and before processing with the silver halide solution physical developing solution.

Processing with Silver Halide Solution Physical Developing Solution:

After an optional washing, the imagewise exposed precursor is then generally processed in a silver halide solution physical developing solution to improve conductivity of the silver image, for example, the predetermined silver metal pattern on one or both sides of the supporting sides of the substrate.

The silver halide solution physical developing solution generally can have a pH of at least 8 and up to and including 13 or typically of at least 8 and up to and including 12. The pH can be provided using known alkaline reagents along with the compounds described below.

This silver halide solution physical developing solution comprises one or more primary developing agents as an essential component, chosen from one or more of hydroquinone or its derivatives or one or more ascorbic acid or derivatives thereof. Examples of such compounds are provided above. The primary developing agents in the silver halide solution physical developing solution can be the same or different as the primary developing agents in the silver halide developing solution described above.

The one or more primary developing agents in the silver halide solution physical developing solution can be present in a total amount of at least 0.01 mol/l and up to and including 1 mol/l or typically of at least 0.05 mol/l and up to and including 0.2 mol/l. This concentration refers to the total amount of primary developing agents if a mixture of such compounds is used.

In addition, the silver halide solution physical developing solution comprises one or more silver halide dissolution catalysts as essential components in an amount of at least 0.001 mol/l and up to and including 0.1 mol/l, or typically of at least 0.005 mol/l and up to and including 0.05 mol/l. These concentrations refer to the total amount of silver halide dissolution catalysts when a mixture of such compounds is used.

Useful silver halide dissolution catalysts include but are not limited to, alkali metal thiocyanate salts such as sodium thiocyanate and potassium thiocyanate, thioethers such as 3,6-dithia-1,8-octanediol, and heterocyclic thiones such as tetrahydro-4,6-dimethyl-1,3,5-triazine-2(1H)-thione, and tetrahydro-3-hydroxyethyl-1,3,5-triazine-2(1H)-thione. These compounds can readily complex with silver.

The silver halide solution physical developing solution used in the present invention contains substantially no catalytic developing agents such as those compounds described above for the silver halide developing solution. The term "substantially no" means that less than 0.001 mol/l or even less than 0.0001 mol/l of such compounds are purposely incorporated into or created in the solution.

The silver halide solution physical developing solution can further comprise one or more alkali metal sulfites include sodium sulfite, potassium sulfite, and mixtures thereof. The alkali metal sulfites can be present in the silver halide solution physical developing solution in a total amount of at least 0.2 mol/l and up to and including 3 mol/l or typically of at least 0.5 mol/l and up to and including 1 mol/l when potassium sulfite or sodium sulfite is used or particularly when only potassium sulfite is used. These concentrations refer to the total amount of all sulfites if a mixture of compounds is used.

The silver halide solution physical developing solution can further include one or more polyaminopolycarboxylic acid salts that are capable of complexing with silver ion, including but not limited to, diethylenetriamine pentaacetic acid, pentasodium salt and other similar compounds known in the art. Such compounds can be useful particularly when a sulfite is not present. Such compounds can be present in an amount of at least 0.001 mol/l and up to and including 0.03 mol/l.

The silver halide solution physical developing solution can also include one or more metal ion complexing agents that can complex with silver, calcium, iron, magnesium, or other metal ions that can be present, Silver or calcium metal ion complexing agents can be particularly useful in a total amount of at least 0.001 mol/l.

Particularly useful silver halide solution physical developing solutions include but are not limited to, hydroquinone or a derivative thereof and sodium thiocyanate or potassium thiocyanate, and optionally a sulfite and calcium or silver metal ion complexing agent.

The silver halide physical solution developing solution can be provided at working strength or in a concentrated form that is suitably diluted prior to or during processing using known processing equipment and procedures. For example, the silver halide physical developing solution can be concentrated at least 4 times compared to a desired working strength concentration.

Thus, the silver halide solution physical developing solution is used to process or treat the imagewise exposed precursor for a suitable time and at a suitable temperature, at generally atmospheric pressure to provide an electrical conductivity of the resulting first silver image that is as least 2 times the electrical conductivity of the first silver image (or second silver image) after processing the imagewise exposed precursor only with the silver halide developing solution.

The conductivity measurements of the first silver image are obtained as described below in the Examples.

For this processing feature, the temperature can range from at least 20° C. and up to and including 60° C. or typically of at least 35° C. and up to and including 45° C. Useful processing times can range from at least 30 seconds and up to and including 6 minutes but more likely at least 2 minutes and up to and including 4 minutes. A skilled worker could use routine experimentation to find the optimum processing conditions to achieve the desired conductivity results. A washing or rinsing treatment using water or a suitable aqueous solution can be carried out for a suitable time and at a suitable temperature after this processing feature and before the treatment with the fixing solution.

In many embodiments, the same silver halide developing solution, silver halide solution physical developing solution and fixing solution are used for forming the first and second silver images after imagewise exposure of both sides.

Fixing:

After processing with the silver halide solution physical developing solution and an optional washing, remaining undeveloped silver ions (in any layer) can be removed by treating the imagewise exposed and developed precursor with a fixing solution. Fixing solutions are well known in the black-and-white photographic art and contain one or more compounds that complex the silver halide for removal from the layers in which it is present. Thiosulfate salts are commonly used in fixing solutions. The fixing solution can optionally contain a hardening agent such as alum or chromealum. The developed film can be processed in a fixing solution immediately after the silver halide solution physical development, or there can be an intervening stop bath or water wash or both. Fixing can be carried out at any suitable temperature and time such as at least 20° C. for at least 30 seconds.

After fixing, the electrically-conductive article containing the first silver image (and optional second silver image) can be washed or rinsed in water that can optionally include surfactants or other materials to reduce water spot formation upon drying, which is optional before the next processing feature. Drying can be accomplished in ambient or by heating, for example, in a convection oven at a temperature above 50° C. but below the glass transition temperature of the substrate.

Fixing then leaves the silver metal particles in the first silver image (generally in a silver pattern) in each formerly non-color hydrophilic photosensitive layer. This fixing also removes any non-developed silver ions in each hydrophilic overcoat. The same effects are provided on the opposing second supporting side for the duplex conductive film element precursors described herein.

It is desired that, after processing in the fixing solution, the resulting conductive film element exhibit a (visual) $D_{min}$ of less than or equal to 0.03.

After fixing, the article can be washed or rinsed in water that can optionally include surfactants or other materials to reduce water spot formation upon drying.

Conductivity Enhancement:

After fixing and optional rinsing and before drying as described above, the electrically-conductive article comprising the first silver image (and optional second silver image) can be further washed or rinsed with water and then treated to further enhance the electrical conductivity of the silver metal (or nuclei) in each silver image on each supporting side of the substrate. A variety of ways have been proposed to carry out this "conductivity enhancement" process. For example, U.S. Pat. No. 7,985,527 (Tokunaga) and U.S. Pat. No. 8,012,676 (Yoshiki et al.) describe treatments using hot water baths, water vapor, reducing agents, or halides. The details of such treatments are provided in these patents, the disclosures of which are incorporated herein by reference.

It is also possible enhance electrical conductivity of the silver metal particles in each silver image by repeated contact (treatment) with a conductivity enhancing agent followed by optional washing and drying, and repeating this cycle of treating for conductivity enhancement with optional washing and drying generally one or more times. Useful conductivity enhancing agents include but are not limited to, sulfites, borane compounds, hydroquinones, p-phenylenediamines, and phosphites. This treatment can be carried out at a temperature of at least 30° C. and up to and including 90° C. for at least 0.25 minute and up to and including 30 minutes.

Additional Treatments:

Prebath solutions can also be used to treat the exposed silver salts prior to the silver halide development described above. Such prebath solutions can include one or more development inhibitors as described above and in the same or different amounts. Effective development inhibitors include but are not limited to, benzotriazoles, heterocyclic thiones, and mercaptotetrazoles. The prebath temperature can be in a range as described above for the silver halide development step. Prebath time depends upon concentration and the particular inhibitor, but it can range from at least 10 seconds and up to and including 4 minutes.

It can be useful in some embodiments to treat the conductive film element with a hardening bath after fixing and before drying to improve the physical durability of the resulting conductive film element. Such hardening baths can include one or more known hardening agents in appropriate amounts that would be readily apparent to one skilled in the art.

Additional treatments of the conductive film element, such as treatment with a stabilizing bath, can also be carried out before a final drying if desired, at any suitable time and temperature.

The method of this invention can be carried out using a conductive film element precursor comprising on both first and opposing second supporting sides of the substrate, suitable first and second non-color hydrophilic photosensitive layers and first and second hydrophilic overcoats disposed over the first and second non-color hydrophilic photosensitive layers, respectively, the first and second hydrophilic overcoats being the outermost layers on the respective first supporting and opposing second supporting sides of the substrate.

In such methods, both first and second non-color hydrophilic photosensitive layers are appropriately exposed to provide the same or different (usually different) latent patterns containing silver halide in the first and second non-color hydrophilic photosensitive layer. These different exposures can be simultaneous or sequential in manner. In many embodiments, both sides are exposed simultaneously.

The silver halides in the latent images formed in the two opposing non-color hydrophilic photosensitive layers are then converted to silver metal particles on both sides during the processing treatments described above. Thus, both latent images can be developed and fixed simultaneously.

Unconverted silver ions can be removed from the first and second non-color hydrophilic photosensitive layers, leaving silver metal particles in the respective first and second patterns corresponding to the first and second latent patterns on opposing supporting second sides of the substrate.

During such processes, the same silver halide developing solution, silver halide solution physical developing solution, and fixing solutions are used for forming both first and second silver images.

Optionally and desirably, the silver metal particles in the patterns on both sides of the element can be further treated as described above to enhance silver metal conductivity.

In many embodiments, the resulting conductive film element has at least a predetermined electrically-conductive silver metal electrode grid (pattern) on at least the first supporting side of the substrate and desirably an electrically-conductive silver metal electrode grid (pattern) on the opposing second supporting side of the substrate that are different in composition, pattern arrangement, conductive line thickness, or shape of the grid lines (for example, hexagonal, rhombohedral, octagonal, square, circular, or irregular). For example, the electrically-conductive silver metal electrode grid on the first supporting side of the substrate can have an electrically-conductive silver metal electrode grid in a square pattern, and the electrically-conductive silver metal electrode grid on the opposing supporting second side of the substrate can have a diamond pattern.

The conductive film elements prepared using the present invention can be used as formed, or they can be further treated for example to electrolessly plate a conductive metal (such as copper, palladium, platinum, aluminum, tin, or gold) onto the first (and second) silver image. The same or different electrolessly plated conductive metals can be provided on the first and second silver images on opposing supporting sides of the substrate.

Silver Management

In processes that employ developers that readily dissolve silver halide, there is a risk that the resulting soluble silver ions can migrate out of the photosensitive silver halide emulsion and they can then react with black-and-white developing agents to form metallic silver. The metallic silver in turn presents a problem of precipitation or sludge formation rendering the developer undesirable. In these cases, it is desirable to remove the dissolved silver ions from the developer solution before they accumulate and become reduced to metallic silver in the processing tanks. The removal of soluble silver ions can be accomplished in a number of different ways, including electrolytic plating, chemical plating onto a substrate containing active nucleation sites such as Cary-Lea silver (for example as described in U.S. Pat. No. 5,188,662 (McGuckin et al.), or using an ion exchange resin that has a high affinity for silver ions. Removal by certain ion exchange resins, commonly called chelating resins, is more useful for simpler processes. A number of chelating resins with high capacity and specificity for silver ion are commercially available from various sources.

The present invention provides at least the following embodiments and combinations thereof, but other combinations of features are considered to be within the present invention as a skilled artisan would appreciate from the teaching of this disclosure:

1. A method for providing an electrically-conductive silver image on a transparent substrate in a conductive film element, the method comprising, in order:

imagewise exposing a conductive film element precursor comprising a transparent substrate having a first supporting side and an opposing second supporting side, and the conductive film element precursor comprising on the first supporting side, in order, a first non-color hydrophilic photosensitive layer comprising photosensitive silver halide, and optionally a first hydrophilic overcoat disposed over the first non-color hydrophilic photosensitive layer, to provide an imagewise exposed precursor comprising a first latent silver image in the first non-color hydrophilic photosensitive layer, processing the imagewise exposed precursor in a silver halide developing solution having a pH of at least 8 and up to and including 13, and comprising: (a) a primary developing agent that is a hydroquinone or ascorbic acid or derivative of either, in an amount of at least 0.01 mol/l and up to and including 1 mol/l, and (b) a catalytic developing agent that is a p-aminophenol or a phenidone or derivative of either, in an amount of at least 0.001 mol/l and up to and including 0.1 mol/l, for at least 10 seconds, to provide a first silver image corresponding to the first latent silver image in the first non-color hydrophilic photosensitive layer, processing the imagewise exposed precursor in a silver halide solution physical developing solution comprising: (a) a primary developing agent that is a hydroquinone or ascorbic acid or derivative of either, in an amount of at least 0.01 mol/l and up to and including 1 mol/l, and (c) a silver halide dissolution catalyst in an amount of at least 0.001 mol/l and up to and including 0.1 mol/l, and substantially no (b) catalytic developing agent, for at least 30 seconds at a temperature of at least 20° C., to provide a conductivity of the silver image that is at least 2 times the conductivity of the first silver image after only the processing with the silver halide developing solution, processing the imagewise exposed precursor in a fixing solution to remove remaining silver ions and to provide a conductive film element containing the first silver image, treating the conductive film element to enhance electrical conductivity of the first silver image, and optionally washing and drying the conductive film element.

2. The method of embodiment 1, wherein the conductive film element exhibits a (visual) $D_{min}$ of less than or equal to 0.03 after processing in the fixing solution.

3. The method of embodiment 1 or 2, wherein the cycle of treating to enhance electrical conductivity and optional washing and drying cycle are repeated at least once.

4. The method of any of embodiments 1 to 3, wherein the first silver image is provided in a predetermined electrically-conductive silver pattern.

5. The method of any of embodiments 1 to 4, wherein the first non-color hydrophilic photosensitive layer comprises one or more silver halides to provide a total silver metal coverage of less than 5000 mg Ag/m$^2$.

6. The method of any of embodiments 1 to 5, wherein the conductive film element precursor further comprises a first hydrophilic overcoat disposed over the first non-color hydrophilic photosensitive layer, which first hydrophilic overcoat optionally comprises one or more silver halides to provide silver metal at a coverage of at least 5 mg Ag/m$^2$ and up to and including 150 mg Ag/m$^2$ and the one or more silver halides each have a grain ESD of at least 30 nm and up to and including 300 nm.

7. The method of embodiment 6, wherein the first hydrophilic overcoat further comprises an ultraviolet radiation absorber.

8. The method of any of embodiments 1 to 7, wherein the exposing is carried out using radiation directed at the conductive film element precursor from the first supporting side of the transparent substrate.

9. The method of any of embodiments 1 to 8, wherein the silver halide developing solution further comprises an alkali metal sulfite in an amount of at least 0.1 mol/l and up to and including 1 mol/l.

10. The method of any of embodiments 1 to 9, wherein the silver halide developing solution further comprises one or more of an alkali metal halide, an arylmercaptotetrazole, a benzotriazole, an aryl or alkyl disulfide, or an aryl or alkyl thiol.

11. The method of any of embodiments 1 to 10, wherein the silver halide solution physical developing solution comprises an alkali metal thiocyanate salt as the silver halide dissolution catalyst in an amount of at least 0.001 mol/l and up to and including 0.1 mol/l.

12. The method of any of embodiments 1 to 11, wherein the silver halide solution physical developing solution further comprises an alkali metal sulfite in an amount of at least 0.2 mol/l and up to and including 3 mol/l.

13. The method of any of embodiments 1 to 12, wherein the conductive film element precursor further comprises, on the opposing second supporting side of the transparent substrate, a second non-color hydrophilic photosensitive layer and optionally second hydrophilic overcoat disposed over the second non-color hydrophilic photosensitive layer, and the method further comprises:

imagewise exposing the conductive film element precursor from the second opposing side of the transparent substrate, to provide a second latent silver image in the second non-color hydrophilic photosensitive layer of the imagewise exposed precursor, processing the imagewise exposed precursor in the same or different silver halide developing solution having a pH of at least 8 and up to and including 13, and comprising: (a) a primary developing agent that is a hydroquinone or ascorbic acid or derivative of either, in an amount of at least 0.01 mol/l and up to and including 1 mol/l, and (b) a catalytic developing agent that is a p-aminophenol or a phenidone or derivative of either, in an amount of at least 0.001 mol/l and up to and including 0.1 mol/l, for at least 10 seconds, to provide a second silver image corresponding to the second latent silver image in the second non-color hydrophilic photosensitive layer, processing the imagewise exposed precursor in the same or different silver halide solution physical developing solution comprising: (a) a primary developing agent that is a hydroquinone or ascorbic acid or derivative of either, in an amount of at least 0.01 mol/l and up to and including 1 mol/l, and (c) a silver halide dissolution catalyst in an amount of at least 0.001 mol/l and up to and including 0.1 mol/l, and substantially no (b) catalytic developing agent, for at least 30 seconds at a temperature of at least 20° C., to provide a conductivity of the silver image that is at least 2 times the conductivity of the second silver image after only the processing with the first developing solution, processing the imagewise exposed precursor in a fixing solution to remove remaining silver ions and to provide a conductive film element containing the second silver image, treating the conductive film element to enhance electrical conductivity of the second silver image, and optionally washing and drying the conductive film element.

14. The method of embodiment 13, the conductive film element precursor further comprises a second hydrophilic overcoat disposed over the second non-color hydrophilic photosensitive layer, which second hydrophilic overcoat optionally comprises one or more silver halides to provide silver metal at a coverage of at least 5 mg Ag/m$^2$ and up to and including 150 mg Ag/m$^2$ and the one or more silver halides each have a grain ESD of at least 30 nm and up to and including 300 nm.

15. The method of embodiment 13 or 14, wherein the same silver halide developing solution, silver halide solution physical developing solution, and fixing solution are used for forming the first and second silver images.

16. The method of any of embodiments 1 to 15, further comprising a washing treatment between processing with the silver halide developing solution and the silver halide solution physical developing solution.

17. A conductive film element provided by the method of any of embodiments 1 to 16 having the first silver image on at least the first supporting side of the transparent substrate.

18. A conductive film element provided by any of embodiments 1 to 17 having the first silver image on the first supporting side of the transparent substrate and the second silver image on the opposing second supporting side of the transparent substrate.

19. The conductive film element of claim 17, further comprising an electrolessly plated conductive metal on the first silver image.

20. The conductive film element of embodiment 18, further comprising an electrolessly plated conductive metal on the first silver image, and the same or different electrolessly plated conductive metal on the second silver image.

21. A silver halide developing solution having a pH of at least 8 that is useful in any of embodiments 1 to 17, the silver halide developing solution comprising:

(a) a primary developing agent that is a hydroquinone or ascorbic acid or derivative of either in an amount of at least 0.01 mol/l and up to and including 0.15 mol/l, (b) a catalytic developing agent that is a p-aminophenol or a phenidone or derivative of either in an amount of at least 0.001 mol/l and up to and including 0.025 mol/l, and (c) one or more development inhibitors in a total amount of at least 0.25 mmol/l and up to and including 2.5 mmol/l.

22. The silver halide developing solution of embodiment 21, further comprising an alkali metal sulfite in an amount of at least 0.1 mol/l and up to and including 1 mol/l.

23. The silver halide developing solution of embodiment 21 or 22, wherein the one or more development inhibitors comprises one or more of an alkali metal halide, an arylmercaptotetrazole, a benzotriazole, an aryl or alkyl disulfide, or an aryl or alkyl thiol.

24. The silver halide developing solution of any of embodiments 21 to 23, wherein the one or more development inhibitors comprises at least one of each of an arylmercaptotetrazole, a benzotriazole, and a disulfide in a total amount of at least 0.5 mmol/l and up to and including 1.5 mmol/l.

25. The silver halide developing solution of any of embodiments 21 to 24 having a pH of at least 10 and up to and including 11.

26. The silver halide developing solution of any of embodiments 21 to 25, wherein the primary developing agent is hydroquinone or a derivative thereof, and the catalytic developing agent is a phenidone.

27. The silver halide developing solution of any of embodiments 21 to 26, wherein the total concentration of the primary developing agent is at least 100 times the total concentration of the catalytic developing agent.

28. The silver halide developing solution of any of embodiments 21 to 27 that is concentrated at least 5 times compared to a desired working strength concentration.

29. A silver halide solution physical developing solution useful in the method of any of embodiments 1 to 27, the silver halide solution physical developing solution comprising:

(a) a primary developing agent that is a hydroquinone or ascorbic acid or derivative of either, in an amount of at least 0.01 mol/l and up to and including 1 mol/l, and (c) a silver halide dissolution catalyst in an amount of at least 0.001 mol/l and up to and including 0.1 mol/l, and the silver halide solution physical developing solution containing substantially no (b) catalytic developing agent.

30. The silver halide solution physical developing solution of embodiment 29, further comprising an alkali metal sulfite in an amount of at least 0.2 mol/l and up to and including 3 mol/l.

31. The silver halide solution physical developing solution of embodiment 29 or 30, further comprising sodium sulfite or potassium sulfite in an amount at least 0.5 mol/l and up to and including 1 mol/l.

32. The silver halide solution physical developing solution of any of embodiments 29 to 31, wherein the silver halide dissolution catalyst is an alkali metal thiocyanate in an amount of at least 0.005 mol/l and up to and including 0.05 mol/l.

33. The silver halide physical developing solution of any of embodiments 29 to 32 further comprising one or more metal ion complexing agents in a total amount of at least 0.001 mol/l.

34. The silver halide physical developing solution of embodiment 33 further comprising a calcium or silver metal ion complexing agent as a metal ion complexing agent in a total amount of at least 0.001 mol/l.

35. The silver halide physical developing solution of any of embodiments 29 to 34 having a pH of at least 8 and up to and including 12.

36. The silver halide physical developing solution of any of embodiments 29 to 35, wherein the primary developing agent is hydroquinone or a derivative thereof, and the silver halide dissolution catalyst is sodium thiocyanate or potassium thiocyanate.

37. The silver halide physical developing solution of embodiment 36, further comprising a sodium sulfite or potassium sulfite in an amount of at least 0.5 mol/l and up to and including 1 mol/l.

38. The silver halide physical developing solution of any of embodiments 29 to 37 that is concentrated at least 4 times compared to a desired working strength concentration.

The following Examples are provided to illustrate the practice of this invention and are not meant to be limiting in any manner.

Conductive film element precursors (identified Element 1 and Element 2) were prepared using a 125 µm polyethylene terephthalate) substrate that was coated with a non-color photosensitive silver halide emulsion (Emulsion 1) containing 98 mol % silver chloride and 2 mol % silver iodide. The emulsion grains had cubic morphology and an edge length 0.36 µm, and it was hardened using BVSM [1,1'-(methylene(sulfonyl))bis-ethane] coated at 0.5 weight % of total gelatin to be a part of Layer 2 below.

A first layer (Layer 1) was provided directly on the substrate for UV absorption. The UV absorption at 365 nm increased to 1.7 optical density units. Layer 1 included 1500 mg/m$^2$ of gelatin and 300 mg/m$^2$ of TINUVIN 328 UV absorbing dye.

A photosensitive silver halide emulsion layer (Layer 2), which included Emulsion 1 was provided over Layer 1. For Element 1, the silver (Ag) to gelatin weight ratio was kept constant at 2.33:1 (or at a volume ratio of about 0.297:1). For Element 2, the silver (Ag) to gelatin weight ratio was kept constant at 2.45:1 (or at a volume ratio of about 0.313:1).

Both Elements 1 and 2 further included a hydrophilic overcoat layer (Layer 3) over Layer 2, which Layer 3 included 488 mg/m$^2$ of gelatin, 6 mg/m$^2$ of 0.6 µm insoluble polymeric matte particles, and conventional coating surfactants.

The conductive film element precursors of Element 1 were imagewise exposed through a chromed design mask having a diamond-shaped grid pattern with corner-to-corner dimensions of 300 µm (vertical)×500 µm (horizontal). The grid lines on the mask were approximately 3 µm wide. The width of each channel was 4.8 mm. The length of each channel was 85 mm. The exposure was made with UV radiation at a wavelength of 365 nm.

The imagewise exposed silver halide films were processed to reduce the silver cations to silver metal and to form conductive film elements using the processing sequences shown below in TABLE I. The evaluation results of the conductive film elements are also shown below in TABLE I.

TABLE I

Processing Sequence and Results for Element 1

| Processing Step | Processing Solution | Temp. (° C.) All Trials | Example 1- Invention Time (seconds) | Example 2- Comparison Time (seconds) | Example 3- Comparison Time (seconds) | Example 4- Comparison Time (seconds) | Example 5- Comparison Time (seconds) | Example 6- Comparison Time (seconds) |
|---|---|---|---|---|---|---|---|---|
| First Developing | Developer 1A | 40 | 20 | 20 | 60 | None | None | 20 |
| Washing | Water | 40 | 60 | 60 | 60 | None | None | 60 |
| Second Developing | Developer 2A | 40 | 180 | None | None | 180 | None | None |
|  | Developer 2B | 40 | None | None | None | None | 180 | 180 |
| Fixing | Fixing solution | 40 | 60 | 60 | 60 | 60 | 60 | 60 |
| Washing | Water | 40 | 60 | 60 | 60 | 60 | 60 | 60 |
| Drying |  | 60 | 600 | 600 | 600 | 600 | 600 | 600 |
| Relative Resistance |  |  | 1.0 | 40 | 10 | >300 | 1.5 | 0.6 |
| Visual $D_{min}$ |  |  | 0.024 | 0.023 | 0.025 | 0.023 | 0.086 | 0.072 |

The resistances of five identical channels described above, were measured using a two-point probe on contact pads located at the end of each conducting channel and the two-point probe is connected to an ohmmeter. Visual $D_{min}$ was measured in a non-exposed region of the conductive film elements using an X-Rite Model 310 densitometer. Visual density was a weighted average of red, green, and blue densities designed to simulate the sensitivity of the human eye. The relative resistances and visual $D_{min}$ values for the six trials are included in TABLE I to demonstrate the advantage of the present invention. The combination of Developer 1A and Developer 2A (Invention Example 1) provided both low resistance and low visual $D_{min}$. Developer 1A alone (Comparison Examples 2 and 3) or Developer 2A alone (Comparison Example 4) exhibited very high resistance. A conventional black and white developer, Developer 2B gave low resistance (Comparison Example 5), but very high visual $D_{min}$. Developer 1A used in combination with the conventional black and white developer, Developer 2B (Comparison Example 6) also gave good resistance, but unacceptable visual $D_{min}$.

The conductive film element precursors of Element 2 were exposed as described above and then processed using the processing sequences shown below in TABLE II. The sheet resistances were obtained using two-point probe measurements that were made on a 1×1 inch (2.54 cm×2.54 cm) grid using the contact pads in direct contact with that grid, yielding resistances in units of ohms/square.

The sheet resistance values for the four trials are included in TABLE II demonstrate the advantage of the present invention. Combinations of the first developer and second developer used in the practice of the present invention (Invention Examples 7, 8, and 9) provided much lower sheet resistance compared to using a single conventional developer comprised of ascorbic acid and N-methyl-p-aminophenol (Comparison Example 10).

The compositions of the processing solutions used in these Examples are shown in TABLES III through IX. All of these processing solutions were aqueous solutions prepared using demineralized water.

TABLE III

Developer 1A

| Components | g/liter |
|---|---|
| Potassium hydroxide, 45.5% solution | 10.83 |
| Sodium bromide | 5.00 |
| 4,4-Dimethyl-1-phenyl-3-pyrazolidinone | 0.33 |
| 1-Phenyl-5-mercaptotetrazole | 0.13 |
| 5-Methylbenzotriazole | 0.17 |
| 50% solution of sodium hydroxide | 1.82 |
| Phosphonic acid, (nitrilotris(methylene))-tris-, pentasodium salt | 0.29 |
| N,N'-1,2-Ethanediylbis(N-(carboxymethyl)-glycine | 1.77 |
| Sodium carbonate monohydrate | 8.33 |

TABLE II

Processing Sequence and Results for Element 2

| Processing Step | Solution | Temp. (° C.) All Trials | Example 7- Invention Time (seconds) | Example 8- Invention Time (seconds) | Example 9- Invention Time (seconds) | Example 10- Comparison Time (seconds) |
|---|---|---|---|---|---|---|
| First Developing | Developer 1A | 40 | 20 | 20 | 20 | Nnone |
|  | Developer 1B | 40 | None | None | None | 120 |
| Washing | Water | 40 | 60 | 60 | 60 | 60 |
| Second Developing | Developer 2A | 40 | 180 | None | None | None |
|  | Developer 2C | 40 | None | 180 | None | None |
|  | Developer 2D | none | None | None | 180 | None |
| Fixing | Fixing solution | 40 | 60 | 60 | 60 | 60 |
| Washing | Water | 40 | 60 | 60 | 60 | 60 |
| Drying |  | 60 | 600 | 600 | 600 | 600 |
| Sheet Resistance |  |  | 73 | 290 | 635 | >100,000 |
| Visual $D_{min}$ |  |  | 0.031 | 0.034 | 0.030 | 0.033 |

TABLE III-continued

Developer 1A

| Components | g/liter |
| --- | --- |
| Potassium sulfite, 45% solution | 83.33 |
| Hydroquinone | 12.50 |
| 5,5'-(dithiobis(4,1-phenyleneimino))bis(5-oxo-pentanoic acid | 0.12 |
| pH | 10.55 |

TABLE IV

Developer 1B

| Components | g/liter |
| --- | --- |
| Ascorbic acid | 8.00 |
| Sodium carbonate | 17 |
| N-Methyl-p-aminophenol | 1.80 |
| 5-Methylbenzotriazole | 0.16 |
| pH | 10.10 |

TABLE V

Developer 2A

| Components | g/liter |
| --- | --- |
| Sodium sulfite | 92.54 |
| Hydroquinone | 4.630 |
| N,N-Bis(2-(bis(carboxymethyl)-amino)ethyl)- Glycine, pentasodium salt | 0.950 |
| Sodium tetraborate pentahydrate | 2.830 |
| Sodium thiocyanates | 0.42 |
| pH | 9.11 |

TABLE VI

Developer 2B

| Components | g/liter |
| --- | --- |
| Sodium sulfite | 92.54 |
| N-Methyl-p-aminophenol | 1.85 |
| Hydroquinone | 4.63 |
| N,N-Bis(2-(bis(carboxymethyl)-amino)ethyl)- Glycine, pentasodium salt | 0.95 |
| Sodium tetraborate pentahydrate | 2.83 |
| Sodium thiocyanate | 0.42 |
| pH | 9.11 |

TABLE VII

Developer 2C

| Components | g/liter |
| --- | --- |
| Ascorbic acid | 8.00 |
| Sodium carbonate | 17 |
| Diethylenetriamine pentaacetic acid, pentasodium salt | 7.56 |
| pH | 10.10 |

TABLE VIII

Developer 2D

| Components | g/liter |
| --- | --- |
| Ascorbic acid | 8.00 |
| Sodium carbonate | 17 |
| Sodium sulfite | 12 |
| Potassium thiocyanate | 0.10 |
| 5-Phenyl mercaptotetrazole | 0.15 |
| pH | 10.10 |

TABLE IX

Fixing Solution

| Components | g/liter |
| --- | --- |
| Acetic acid | 24.43 |
| Sodium hydroxide, 50% solution | 10.25 |
| Ammonium thiosulfite | 246.50 |
| Sodium metabisulfite | 15.88 |
| Sodium tetraborate pentahydrate | 11.18 |
| Aluminum sulfate, 18.5% solution | 36.26 |
| pH | 4.30 |

The invention has been described in detail with particular reference to certain preferred embodiments thereof, but it will be understood that variations and modifications can be effected within the spirit and scope of the invention.

The invention claimed is:

1. A method for providing an electrically-conductive silver image on a transparent substrate in a conductive film element, the method comprising, in order:

imagewise exposing a conductive film element precursor comprising a transparent substrate having a first supporting side and an opposing second supporting side, and the conductive film element precursor comprising on the first supporting side, in order, a first non-color hydrophilic photosensitive layer comprising photosensitive silver halide, and optionally a first hydrophilic overcoat disposed over the first non-color hydrophilic photosensitive layer, to provide an imagewise exposed precursor comprising a first latent silver image in the first non-color hydrophilic photosensitive layer, processing the imagewise exposed precursor in a silver halide developing solution having a pH of at least 8 and up to and including 13, and comprising: (a) a primary developing agent that is a hydroquinone or ascorbic acid or derivative of either, in an amount of at least 0.01 mol/l and up to and including 1 mol/l, and (b) a catalytic developing agent that is a p-aminophenol or a phenidone or derivative of either, in an amount of at least 0.001 mol/l and up to and including 0.1 mol/l, for at least 10 seconds, to provide a first silver image corresponding to the first latent silver image in the first non-color hydrophilic photosensitive layer, after only a washing of the imagewise exposed precursor with the first silver image, processing the imagewise exposed precursor in a silver halide solution physical developing solution comprising: (a) a primary developing agent that is a hydroquinone or ascorbic acid or derivative of either, in an amount of at least 0.01 mol/l and up to and including 1 mol/l, and (c) a silver halide dissolution catalyst in an amount of at least 0.001 mol/l and up to and including 0.1 mol/l, and substantially no (b) catalytic developing agent, for at least 30 seconds at a temperature of at least 20° C., to provide a conductivity of the first silver image that is at least 2 times the conductivity of the first silver image provided by processing the first latent silver image with the silver halide developing solution, processing the imagewise exposed precursor in a fixing solution to remove remaining silver ions and to provide a conductive film element containing the first silver image, treating the conductive film element to enhance electrical conductivity of the first silver image, and optionally washing and drying the conductive film element.

2. The method of claim 1, wherein the conductive film element exhibits a (visual) $D_{min}$ of less than or equal to 0.03 after processing in the fixing solution.

3. The method of claim 1, wherein the cycle of treating to enhance electrical conductivity and optional washing and drying cycle are repeated at least once.

4. The method of claim 1, wherein the first silver image is provided in a predetermined electrically-conductive silver pattern.

5. The method of claim 1, wherein the first non-color hydrophilic photosensitive layer comprises one or more silver halides to provide a total silver metal coverage of less than 5000 mg Ag/m$^2$.

6. The method of claim 1, wherein the conductive film element precursor further comprises the first hydrophilic overcoat disposed over the first non-color hydrophilic photosensitive layer, which first hydrophilic overcoat optionally comprises one or more silver halides to provide silver metal at a coverage of at least 5 mg Ag/m$^2$ and up to and including 150 mg Ag/m$^2$ and the one or more silver halides each have a grain ESD of at least 30 nm and up to and including 300 nm.

7. The method of claim 6, wherein the first hydrophilic overcoat further comprises an ultraviolet light absorber.

8. The method of claim 1, wherein the exposing is carried out using radiation directed at the conductive film element precursor from the first supporting side of the transparent substrate.

9. The method of claim 1, wherein the silver halide developing solution further comprises an alkali metal sulfite in an amount of at least 0.1 mol/l and up to and including 1 mol/l.

10. The method of claim 1, wherein the silver halide developing solution further comprises one or more of an alkali metal halide, an arylmercaptotetrazole, a benzotriazole, an aryl or alkyl disulfide, or an aryl or alkyl thiol.

11. The method of claim 1, wherein the silver halide solution physical developing solution comprises an alkali metal thiocyanate salt as the silver halide dissolution catalyst in an amount of at least 0.001 mol/l and up to and including 0.1 mol/l.

12. The method of claim 1, wherein the silver halide solution physical developing solution further comprises an alkali metal sulfite in an amount of at least 0.2 mol/l and up to and including 3 mol/l.

13. The method of claim 1, wherein the conductive film element precursor further comprises, on the opposing second supporting side of the transparent substrate, a second non-color hydrophilic photosensitive layer and optionally second hydrophilic overcoat disposed over the second non-color hydrophilic photosensitive layer, and the method further comprises:

imagewise exposing the conductive film element precursor from the second opposing side of the transparent substrate, to provide a second latent silver image in the second non-color hydrophilic photosensitive layer of the imagewise exposed precursor, simultaneously with providing the first silver image in the first non-color hydrophilic photosensitive layer, processing the imagewise exposed precursor in the same silver halide developing solution to provide a second silver image corresponding to the second latent silver image in the second non-color hydrophilic photosensitive layer, after only washing, and simultaneously with processing the first silver image with the silver halide solution physical developing solution, processing the imagewise exposed precursor in the same silver halide solution physical developing solution to provide a conductivity of the second silver image that is at least 2 times the conductivity of the second silver image provided by processing the second latent silver image with the same silver halide developing solution, processing the imagewise exposed precursor in the fixing solution to remove remaining silver ions and to provide a conductive film element containing the second silver image, treating the conductive film element to enhance electrical conductivity of the second silver image, and optionally washing and drying the conductive film element.

14. The method of claim 13, the conductive film element precursor further comprises the second hydrophilic overcoat disposed over the second non-color hydrophilic photosensitive layer, which second hydrophilic overcoat optionally comprises one or more silver halides to provide silver metal at a coverage of at least 5 mg Ag/m$^2$ and up to and including 150 mg Ag/m$^2$ and the one or more silver halides each have a grain ESD of at least 30 nm and up to and including 300 nm.

15. The method of claim 13, wherein the same fixing solution is used for forming the first and second silver images.

16. The method of claim 13, comprising treating the conductive film element to enhance electrical conductivity simultaneously of the first silver image and the second silver image by contacting the conductive film element with the same hot water bath, halide, or conductivity enhancing agent that is a sulfite, borane compound, hydroquinone, p-phenylenediamine, or phosphite.

17. The method of claim 1, comprising treating the conductive film element to enhance electrical conductivity of the first silver image by contacting the conductive film element with a hot water bath, a halide, or a conductivity enhancing agent that is a sulfite, borane compound, hydroquinone, p-phenylenediamine, or phosphite.

* * * * *